United States Patent
Choi et al.

(10) Patent No.: US 9,534,312 B2
(45) Date of Patent: Jan. 3, 2017

(54) SINGLE CRYSTALLINE GRAPHENE SHEET AND PROCESS OF PREPARING THE SAME

(71) Applicant: Samsung Electronics Co., Ltd., Suwon-si, Gyeonggi-do (KR)

(72) Inventors: Jae-young Choi, Yongin-si (KR); Hyeon-Jin Shin, Yongin-si (KR); Seon-mi Yoon, Yongin-si (KR); Jai-yong Han, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/042,438

(22) Filed: Feb. 12, 2016

(65) Prior Publication Data
US 2016/0160379 A1    Jun. 9, 2016

Related U.S. Application Data

(62) Division of application No. 12/170,014, filed on Jul. 9, 2008, now abandoned.

(30) Foreign Application Priority Data

Dec. 17, 2007 (KR) .................. 10-2007-0132682

(51) Int. Cl.
*C30B 1/10* (2006.01)
*C30B 29/02* (2006.01)
(Continued)

(52) U.S. Cl.
CPC ................ *C30B 1/10* (2013.01); *B82Y 30/00* (2013.01); *B82Y 40/00* (2013.01); *C01B 31/0461* (2013.01); *C30B 29/02* (2013.01); *C01B 2204/04* (2013.01)

(58) Field of Classification Search
CPC .. C01B 31/04; C01B 31/0407; C01B 31/0415; C01B 2204/02; C01B 2204/04; C01B 2204/00; C01B 2204/06; C01B 2204/065; C01B 2204/20; C01B 2204/22; C01B 2204/24; C01B 2204/28; C01B 2204/30; C01B 2204/32
(Continued)

(56) References Cited

U.S. PATENT DOCUMENTS 3,285,697 A    11/1966  Li
4,887,273 A    12/1989  Komatsubara et al.
(Continued)

FOREIGN PATENT DOCUMENTS

KR    1020060038910 A    5/2006

OTHER PUBLICATIONS

Abstract for "Pan, et al., Millimeter-Scale, Highly Ordered Single Crystalline Graphene Grown on Ru, (0001) Surface, Condensed Matter".
(Continued)

*Primary Examiner* — Daniel C McCracken
(74) *Attorney, Agent, or Firm* — Cantor Colburn LLP

(57) ABSTRACT

A single-crystal graphene sheet includes a polycyclic aromatic molecule wherein a plurality of carbon atoms are covalently bound to each other, the single-crystal graphene sheet comprising between about 1 layer to about 300 layers; and wherein a peak ratio of a Raman D band intensity to a Raman G band intensity is equal to or less than 0.2. Also described is a method for preparing a single-crystal graphene sheet, the method includes forming a catalyst layer, which includes a single-crystal graphitizing metal catalyst sheet; disposing a carbonaceous material on the catalyst layer; and heat-treating the catalyst layer and the carbonaceous material in at least one of an inert atmosphere and a reducing atmosphere. Also described is a transparent electrode including a single-crystal graphene sheet.

15 Claims, 6 Drawing Sheets

(51) Int. Cl.
*C01B 31/04* (2006.01)
*B82Y 30/00* (2011.01)
*B82Y 40/00* (2011.01)

(58) Field of Classification Search
USPC .................................................. 423/448
See application file for complete search history.

(56) References Cited

U.S. PATENT DOCUMENTS

| | | | |
|---|---|---|---|
| 8,075,864 B2 | 12/2011 | Choi et al. | |
| 8,361,813 B1 | 1/2013 | Niyogi et al. | |
| 8,361,853 B2 | 1/2013 | Cohen et al. | |
| 2003/0104280 A1 | 6/2003 | Venkatesan et al. | |
| 2008/0286541 A1 | 11/2008 | Zeisler et al. | |
| 2009/0068471 A1* | 3/2009 | Choi .................... | B82Y 30/00 428/408 |
| 2009/0110627 A1* | 4/2009 | Choi .................... | B82Y 30/00 423/447.1 |
| 2010/0209330 A1* | 8/2010 | Golzhauser ............ | B82Y 30/00 423/448 |
| 2015/0274530 A1* | 10/2015 | Golzhauser ............ | B82Y 30/00 423/448 |

OTHER PUBLICATIONS

Cancado et al., "General equation for the determination of the crystallite size La of Nanographite by Raman spectroscopy", Applied Physics Letters, vol. 88, 2006, pp. 163106-1-163106-3.

D.D. Smith et al., "Optical observation of "band-to-band" scattering by time-resolved phosphorescence line narrowing: Exciton dephasing in a quasi-one-dimensional solid a)b)", J. Chem. Phys., 71(8), Oct. 15, 1979, pp. 3533-3534.

D.S. Su et al., "Blowing Carbon Nanotubes to CarbonNanobulbs", AIP conference Prodeeidngs, 723, 2004, p. 32.

Fitzer, et al., Recommended Terminology for the Description of Carbon as a Solid, PUre & Appl. Chem., 1995, 67 (3), pp. 473-506.

Geim et al. "The Rise of Graphene," Nature Materials 2007; 6: 183-191.

Graphite, Wikipedia, [online]; [retrieved on Jun. 17, 2014]; retrieved from the Internet http://en.wikipedia.org/wiki/Graphite.

Knight et al. "Characterization of diamond films by Raman spectroscopy," J. Mater. Res.. 1989; 4(2): 385-393.

*KSR international Co.* v. *Teleflex, Inc.*, 550 U.S. 398,127 S. Ct. 1727, 167 LEd2d 705, 82 USPQ2d 1885, 2007, 13 pages.

L. Papagno, M. Conti, "Electronic Structure of Graphitic Carbon on Ni (110)", Surface Science Letters, 219, 1989, pp. L565-L570.

Novoselov, et al., "Electric Field Effect in Atomically Thin charbon Films", Science, 2004, 306: 666-669.

Pan et al., "Millimeter-Scale, Highly Ordered Crystalline Graphene Grown on Ru", 0001 Surface, condensed Matter, arXiv: 0709.2858v1, 2007.

Presland et al. "Growth of Single-Crystal Graphite by Pryolysis of Acetylene Over Metals," Carbon 1969; 7: 1-8.

Scientific Background on the Nobel Prize in Physics 2010, Graphene, the Royal Swedish Academy of Sciences, pp. 1-10, Oct. 5, 2010.

Shibuta et al., "Interaction between two graphene sheets with a sturbostratic orientational relationship", Chemical Physics Letters, 512, 2011, pp. 146-150.

* cited by examiner

HEAT-TREATING

SINGLE CRYSTALLINE GRAPHENE SHEET AND PROCESS OF PREPARING THE SAME

This application is a divisional application of U.S. patent application Ser. No. 12/170,014, and claims priority to Korean Patent Application No. 10-2007-0132682, filed on Dec. 17, 2007, and all the benefits accruing therefrom under 35 U.S.C. §119, the contents of which in their entirety are herein incorporated by reference.

BACKGROUND OF THE INVENTION

1. Field of the Invention

This disclosure relates to a single-crystal graphene sheet and a process of preparing the same.

2. Description of the Related Art

Generally, graphite is a stack of two-dimensional graphene sheets formed from a planar array of carbon atoms bonded to form hexagonal structures. Recently, testing of graphene sheets revealed beneficial properties of single or multiple-layered graphene sheets. One beneficial property of graphene is that electrons flow in an entirely unhindered fashion in a graphene sheet, which is to say that the electrons flow at the velocity of light in a vacuum. In addition, graphene sheets exhibit an unusual half-integer quantum Hall effect for both electrons and holes.

The electron mobility of conventional graphene sheets is about 20,000 to 50,000 $cm^2/Vs$.

In some applications carbon nanotubes can be used as a conductor. However, carbon nanotubes are expensive due to low yields during synthesis and purification processes. Also single wall carbon nanotubes exhibit different metallic and semiconducting characteristics according to their chirality and diameter. Furthermore, single wall carbon nanotubes having identical semiconducting characteristics have different band gap energies depending on their chirality and diameter. Thus, single wall carbon nanotubes are preferably separated from each other in order to obtain the desired semiconducting or metallic properties. However, separating single wall carbon nanotubes can be problematic.

On the other hand, it is advantageous to use graphene sheets in a device, because graphene sheets can be engineered to exhibit the desired electrical characteristics by arranging the graphene sheets so that their crystallographic orientation is in a selected direction since the electrical characteristics of graphene depend on crystallographic orientation. It is envisaged that the characteristics of graphene sheets can be applied to future carbonaceous electrical devices or carbonaceous electromagnetic devices.

Graphene sheets can be prepared using a micromechanical method or by SiC thermal decomposition. According to the micromechanical method, a graphene sheet can be separated from graphite attached to the surface of Scotch™ tape by attaching the tape to a graphite sample and detaching the tape. In this case, the separated graphene sheet does not include a uniform number of layers, and the ripped portions do not have a uniform shape. Furthermore, a large-sized graphene sheet cannot be prepared using the micromechanical method. Meanwhile, in SiC thermal decomposition, a SiC single crystal is heated to remove Si by decomposition of the SiC on the surface thereof, the residual carbon then forming a graphene sheet. However, the SiC single crystal material used as a starting material in SiC thermal decomposition is very expensive, and formation of a large-sized graphene sheet can be problematic.

Accordingly, a process to economically and reproducibly prepare a large-size graphene sheet that has the desired electrical properties is needed.

BRIEF SUMMARY OF THE INVENTION

Disclosed is a single-crystal graphene sheet.

Also disclosed is a process of preparing the single-crystal graphene sheet.

In addition, disclosed is a transparent electrode comprising the single-crystal graphene sheet.

In an embodiment, there is provided a single-crystal graphene sheet, including a polycyclic aromatic molecule wherein a plurality of carbon atoms are covalently bound to each other to form a single crystal, wherein the single-crystal graphene sheet comprises between about 1 to about 300 layers, and wherein a peak ratio of the Raman D band intensity to a Raman G band intensity is equal to or less than 0.2.

The peak ratio of the Raman D band/G band can be 0.

The single-crystal graphene sheet can have between about 1 to about 60 layers.

The single-crystal graphene sheet can have between about 1 to about 15 layers.

Each of a width and a length of the single-crystal graphene sheet can be between about 1 mm to about 1,000 mm.

According to another embodiment, there is provided a method of preparing a single-crystal graphene sheet, the method comprising: forming a catalyst layer, the layer comprising a single-crystal graphitizing metal catalyst sheet; disposing a carbonaceous material on the catalyst layer; and heat-treating the catalyst layer and the carbonaceous material in at least one of an inert atmosphere or reducing atmosphere.

The carbonaceous material can be solid-solubilized in the single-crystal graphitizing metal catalyst sheet.

Disposing a carbonaceous material on the catalyst layer can be performed by coating a carbon-containing polymer on a surface of the catalyst layer, disposing a carbon-containing gas on the catalyst layer, or immersing the catalyst layer in a carbon-containing liquid solution.

The catalyst layer can include a metal selected from the group consisting of Ni, Co, Fe, Pt, Au, Al, Cr, Cu, Mg, Mn, Mo, Rh, Si, Ta, Ti, W, U, V, Zr, and a combination comprising at least one of the foregoing metals.

The heat-treating can be performed at a temperature between about 300° C. to about 2,000° C. for a time between about 0.001 hours to about 1000 hours.

The method can further include separating the single-crystal graphene sheet from the catalyst layer by removing the catalyst layer by treating the single-crystal graphene sheet and the catalyst layer with an acid after the heat-treating.

According to another embodiment, there is provided a transparent electrode comprising the single-crystal graphene sheet.

The transparent electrode can be flexible.

Also disclosed is a method for preparing a single-crystal graphene sheet, including forming a catalyst layer, the catalyst layer including a single-crystal graphitizing metal catalyst sheet; and disposing a self-assembling polymer on the catalyst layer; heat-treating the catalyst layer and the self-assembling polymer in at least one of an inert atmosphere and a reducing atmosphere to solid-solubilize a carbonaceous material in the catalyst layer; and heat-treating at a temperature and for a time sufficient to precipitate the solid-solubilized carbonaceous material and form a single-crystal graphene sheet.

BRIEF DESCRIPTION OF THE DRAWINGS

The above and other aspects, features and advantages will become more apparent by describing in further detail exemplary embodiments thereof with reference to the attached drawings in which.

DETAILED DESCRIPTION OF THE INVENTION

Figure 1:
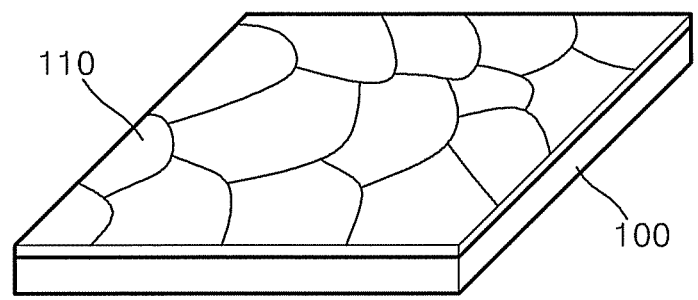
FIG. 1 schematically shows a process to prepare a graphene sheet according to the prior art.
Figure 1:
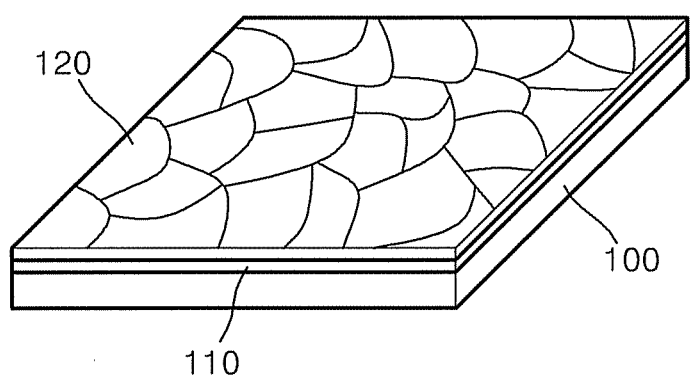

Hereinafter, embodiments are described more fully with reference to the accompanying drawings, in which exemplary embodiments are shown.

The terms "the", "a" and "an" do not denote a limitation of quantity, but rather denote the presence of at least one of the referenced item. The suffix "(s)" as used herein is intended to include both the singular and the plural of the term that it modifies, thereby including at least one of that term (e.g., the colorant(s) includes at least one colorants).

Unless defined otherwise, technical and scientific terms used herein have the same meaning as is commonly understood by one of skill in the art.

As used herein, approximating language can be applied to modify any quantitative representation that can vary without resulting in a change in the basic function to which it is related. Accordingly, a value modified by a term or terms, such as "about" and "substantially," cannot to be limited to the precise value specified, in some cases. In at least some instances, the approximating language can correspond to the precision of an instrument for measuring the value. Thus the modifier "about" used in connection with a quantity is inclusive of the stated value and has the meaning dictated by the context (e.g., includes the degree of error associated with measurement of the particular quantity).

All ranges disclosed herein are inclusive of the endpoints and are independently combinable. The endpoints of all ranges directed to the same component or property are inclusive and independently combinable (e.g., ranges of "less than or equal to about 25 wt %, or, more specifically, about 5 wt % to about 20 wt %," is inclusive of the endpoints and all intermediate values of the ranges of "about 5 wt % to about 25 wt %," etc.).

"Optional" or "optionally" means that the subsequently described event or circumstance can or cannot occur, and that the description includes instances where the event occurs and instances where it does not. As used herein, "substrate" or "substrates" can be used interchangeably with "surface" or "surfaces."

Disclosed is a single-crystal graphene sheet prepared by epitaxial growth using a catalyst layer comprised of a single-crystal graphitizing metal catalyst. Since the single-crystal graphene sheet has uniform shape and is substantially without defects, it can be efficiently applied in a variety of electrical devices or electromagnetic devices, including display devices, solar cells, or the like.

The single-crystal graphene sheet is prepared by disposing a carbonaceous material on the catalyst layer, the catalyst layer optionally disposed on a substrate, and heat-treating the catalyst layer and carbonaceous material in selected conditions to form graphene.

The process of graphene growth will now be described in more detail. A carbonaceous material is disposed on a catalyst layer, and the combination heat-treated so that the carbonaceous material thermally decomposes on the surface of the catalyst layer. The carbonaceous material can be a carbon containing gas. Carbon atoms derived from the carbonaceous material are infiltrated into and solid-solubilized in to the catalyst layer. When the amount of the infiltrated carbon atoms exceeds a solubility limit of the catalyst layer, which is an intrinsic property of the catalyst layer, graphene nucleation occurs and graphene grows to form a single-crystal graphene sheet.

The catalyst layer has a single-crystal structure, not a polycrystalline structure. Because the catalyst layer is a single crystal, it can solve problems, such as defect formation, which can result if a polycrystalline graphitizing metal catalyst is used. A polycrystalline graphitizing metal catalyst can comprise a substrate 100 and plurality of grains of metal catalyst 110, thus can have a granular structure with boundaries between the grains, as is shown in FIG. 1. Formation of graphene on a catalyst with a plurality of grains can result in polycrystalline graphene 120. As a result, the solid-solubilized carbon can precipitate at grain boundaries during the growth of graphene, thereby creating defects in the single-crystal graphene sheet. In addition, since each of the grains can have a different crystallographic orientation, the rate of carbon precipitation in the grains will not be equal, thus decreasing the uniformity of the graphene sheet. However, when the graphitizing metal catalyst has a single-crystal structure, it has been observed that the resulting graphene sheet does not have a substantial number of defects. While not wanting to be bound by theory, it is believed the absence of defects is because a single grain is formed, thus a uniform single-crystal graphene sheet can be formed because the rate of graphene formation is the same throughout the entire surface of the catalyst layer.

The defects formed on the graphene sheet caused by the polycrystalline structure can be identified using Raman spectroscopy, in particular by the existence of a D band. The D band in Raman spectrum indicates the existence of defects in the graphene, and the intensity of the D band is believed to be proportional to the number of defects in the single-crystal graphene sheet.

A peak ratio can be defined as a ratio of the peak Raman D band intensity to the peak Raman G band intensity. A single-crystal graphene sheet prepared by epitaxial growth using the catalyst layer has a peak ratio equal to or less than about 0.2, specifically equal to or less than about 0.01, more specifically equal to or less than about 0.001, and most specifically "0" (zero). The catalyst layer is believed to assist carbon atoms in the carbonaceous material to be bound to each other to form a planar hexagonal structure. A catalyst that is suitable for synthesis of graphite, inducing carbonization, or preparing carbon nanotubes, can be used as the catalyst layer. Exemplary catalysts can have a single-crystal structure, and comprise a metal selected from the group consisting of Ni, Co, Fe, Pt, Au, Al, Cr, Cu, Mg, Mn, Mo, Rh, Si, Ta, Ti, W, U, V Zr, and the like, and a combination comprising at least one of the foregoing metals. The catalyst can comprise an alloy of at least one of the foregoing metals. The catalyst layer can be prepared by forming a single-crystal of the metal or the alloy, or a commercially available single-crystal metal material can be used. The commercially available single-crystal metal can be in a rod shape, which can then be cut into thin films to form sheets. The area of the final single-crystal graphene sheet can vary and depend on the area of the catalyst layer. Thus, a large-sized graphene sheet can be obtained by enlarging the unit area of the catalyst layer. Accordingly, a large-sized graphene sheet can be prepared.

The catalyst layer can be used alone or disposed on a substrate comprised of silicon, or the like. The catalyst layer can be bound to or in intimate contact with the substrate. Using the catalyst layer without a substrate can be more efficient since graphene can be formed on both sides of the catalyst layer.

The carbon atoms can be formed on the catalyst layer by disposing the carbonaceous material on the catalyst layer. The disposing can be performed by various methods including, for example, coating a carbonaceous material on a surface of the catalyst layer, contacting catalyst layer with a gaseous carbonaceous material, or immersing the catalyst layer in a liquid solution comprising the carbonaceous material.

The disposing processes will now be described.

<Coating a Carbonaceous Material on the Surface of a Single Crystalline Graphitizing Metal Catalyst>

Figure 2:
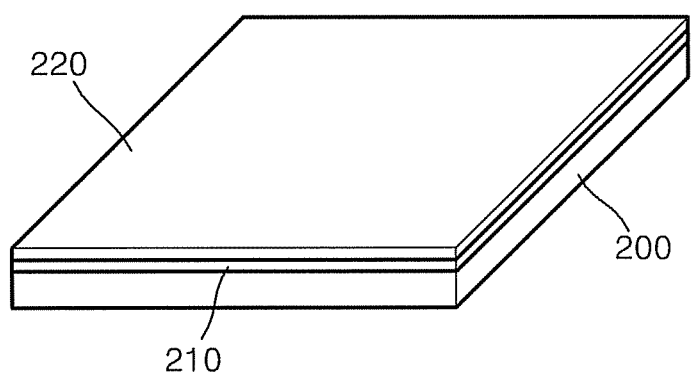
FIG. 2 schematically shows a process to prepare a polycrystalline graphene sheet.
Figure 2:
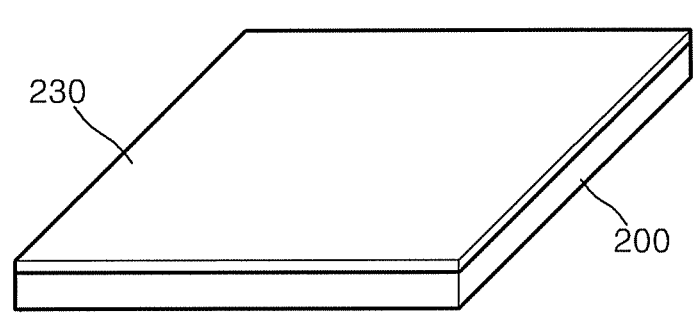
Figure 2:
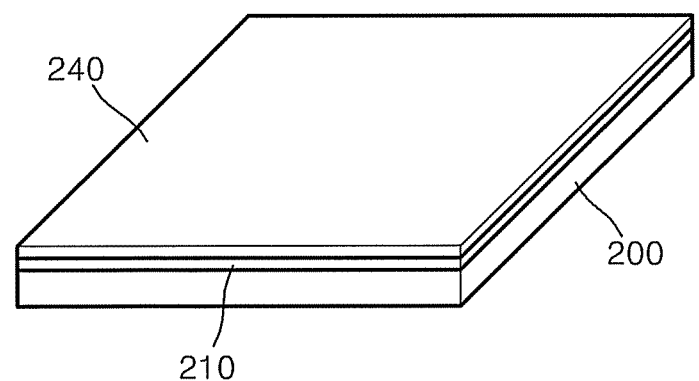
Figure 3:
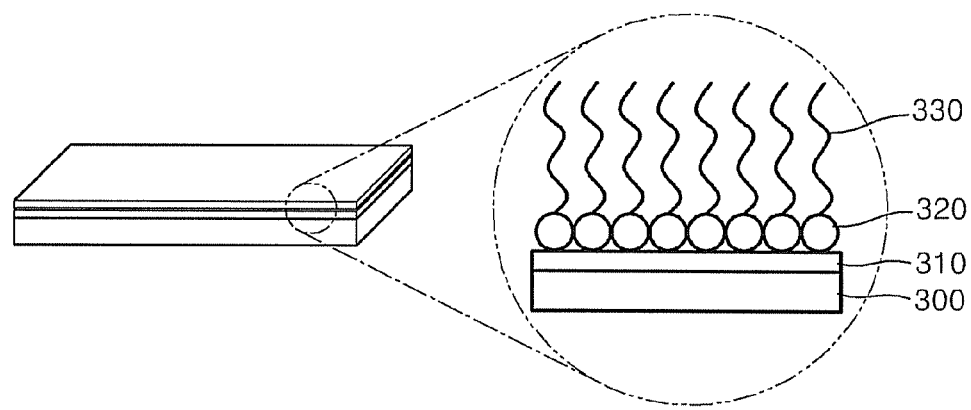
FIG. 3 schematically shows a polymer coated on a catalyst layer.
Figure 4:
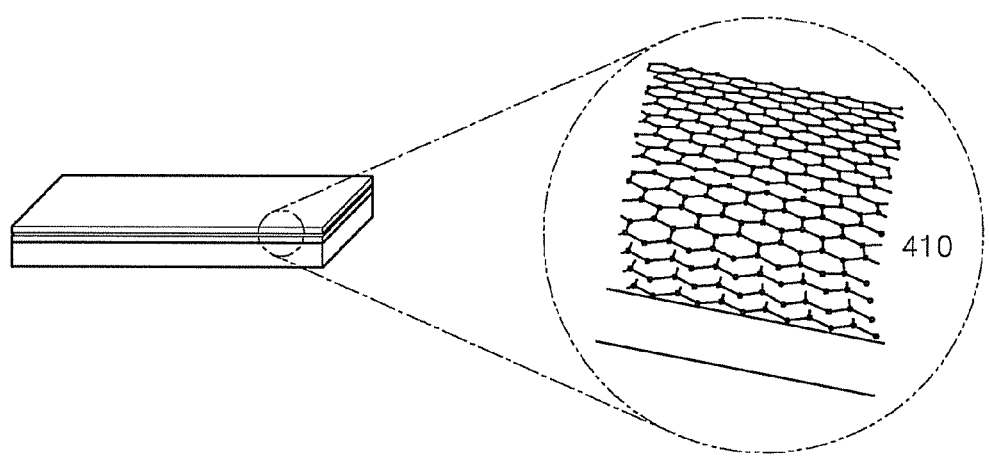
FIG. 4 schematically shows a structure of a single-crystal graphene sheet formed on a catalyst layer.

The carbonaceous material coated on the catalyst layer can be a polymer that can be solid-solubilized in the catalyst layer, or any other polymer containing carbon, without limitation to its structure or composition, as is shown in FIG. 2. A polymer that forms a dense coating can be used in order to form a dense graphene layer. Polymers that are irregularly arranged on the catalyst layer when coated on the catalyst layer by spin coating, dip coating, or the like, can form an irregular network structure, and thus cannot have a dense structure. As is shown in FIG. 2, a polymer 220 can be disposed on a catalyst layer 210, which in turn is disposed on a substrate 200. Heat treating the assembly can cause the polymer to decompose to provide a catalyst layer comprising solid-solubilized carbon 230. If the polymer is irregularly arranged on the catalyst layer 230, further heat-treatment can result in polycrystalline graphene 240. On the other hand, when a self-assembling polymer is coated in the form of a polymer layer on the catalyst layer, the polymer is regularly arranged on the surface of the catalyst layer as is shown in FIG. 3. Shown in FIG. 3 is a polymer having a hydrophobic portion 330 and a hydrophilic portion 320 disposed on a catalyst layer 310 which is in turn disposed on a substrate 300. Heat-treatment of this assembly can provide a single-crystal graphene sheet having a dense structure as shown in FIG. 4, which shows the resulting graphene sheet 410.

Any self-assembling polymer can be used herein without limitation. For example, the self-assembling polymer can be a polymer selected from the group consisting of an amphiphilic polymer, a liquid crystal polymer, a conductive polymer, and the like, and a combination comprising at least one of the foregoing polymers.

The amphiphilic polymer includes a hydrophilic group and a hydrophobic group, and thus can be arranged in a selected direction when disposed in a water soluble solution. For example, Langmuir-Blodgett arrangements, dipping arrangements, spin arrangements, or the like, are possible.

The amphiphilic polymer includes a hydrophilic group and a hydrophobic group. Exemplary hydrophilic groups include an amino group, a hydroxyl group, a carboxyl group, a sulfate group, a sulfonate group, a phosphate group or the like, or a combination comprising at least one of the foregoing groups, or salts thereof. Exemplary hydrophobic groups include a halogen atom, a $C_1$-$C_{30}$ alkyl group, a $C_1$-$C_{30}$ halogenated alkyl group, a $C_2$-$C_{30}$ alkenyl group, a $C_2$-$C_{30}$ halogenated alkenyl group, a $C_2$-$C_{30}$ alkynyl group, a $C_2$-$C_{30}$ halogenated alkynyl group, a $C_1$-$C_{30}$ alkoxy group, a $C_1$-$C_{30}$ halogenated alkoxy group, a $C_1$-$C_{30}$ heteroalkyl group, a $C_1$-$C_{30}$ halogenated heteroalkyl group, a $C_6$-$C_{30}$ aryl group, a $C_6$-$C_{30}$ halogenated aryl group, a $C_7$-$C_{30}$ arylalkyl group, a $C_7$-$C_{30}$ halogenated arylalkyl group, or the like, or a combination comprising at least one of the foregoing groups. Exemplary amphiphilic polymers include capric acid, lauric acid, palmitic acid, stearic acid, myristoleic acid, palmitolic acid, oleic acid, stearidonic acid, linolenic acid, capryl amine, lauryl amine, stearyl amine, oleyl amine, or the like, or a combination comprising at least one of the foregoing polymers.

The self-assembling polymer molecules can be arranged in a selected direction in a liquid state. A conductive polymer can also be used. The conductive polymer can be dissolved in a solvent to form a membrane, and evaporation of the solvent can cause alignment of the polymer molecules to form a crystalline structure. Thus, the polymers can be aligned by dipping arrangement, spin coating arrangement, or the like. Exemplary polymers include polyacetylene, polypyrrole, polythiophene, polyanilline, polyfluorene, poly (3-hexylthiophene), polynaphthalene, poly(p-phenylene sulfide), poly(p-phenylene vinylene), or the like, or a combination comprising at least one of the foregoing polymers.

In addition, a polymer that can self-align in a direction when disposed from a vapor, for example, a conductive polymer disposed using vapor deposition, can also be used. Exemplary conductive polymers include acene and its derivatives, anthracene and its derivatives, heteroanthracene (e.g., benzodithiophene and dithienothiophene) and its derivatives, tetracene and its derivatives (e.g., halogenated tetracene, tetracene derivatives having a polar substituent, tetracene-thiophene hybrid materials, rubrene and alkyl-, and alkoxy-substituted tetracene), hetero tetracene and its derivatives, pentacene and its derivatives (e.g., alkyl- and halogen-substituted pentacene, aryl-substituted pentacene, alkynyl-substituted pentacene, alkynyl-substituted alkyl and alkynyl pentacene and alkynyl-substituted pentacene ether), heteropentacene and its derivatives, heteroacene and its derivatives, or the like, or a combination comprising at least one of the foregoing conductive polymers.

The polymer can include a polymerizable functional group such as a carbon-carbon double bond or triple bond capable of polymerizing to form a crosslink. The polymerizable functional group can be polymerized to crosslink the polymers after formation of the polymer layer by, for example, exposing the polymer layer to UV irradiation after the polymer layer is formed. Since the polymerized polymer has a large molecular weight, evaporation of carbon during the heat treatment of the polymer can be substantially prevented.

The polymerization of the polymer can be performed before or after coating the polymer on the catalyst layer. That is, when polymerization is induced in the polymer before coating, a self-supporting polymer layer can be formed, and the polymer layer on the catalyst layer can be formed by transferring a polymer membrane to the catalyst layer. The polymerization and transfer processes can be repeated several times to control the thickness of the graphene.

The polymer can be aligned on the surface of the catalyst layer using various coating methods, including Langmuir-Blodgett, dip coating, spin coating, vacuum deposition, or the like, or a combination comprising at least one of the foregoing coating methods to form an aligned polymer. The molecular weight of the aligned polymer, thickness of the polymer layer, or the number of self-assembled polymer layers can be selected depending on a desired number of layers in the resulting graphene sheet. That is, use of a polymer having a large molecular weight increases the number of layers of the graphene sheet since the polymer has a large amount of carbon. As the thickness of the polymer layer is increased, the number of layers of graphene formed is increased, and thus the thickness of the graphene sheet is also increased. The thickness of the graphene can be controlled using the molecular weight and the amount of the polymer.

Figure 5:
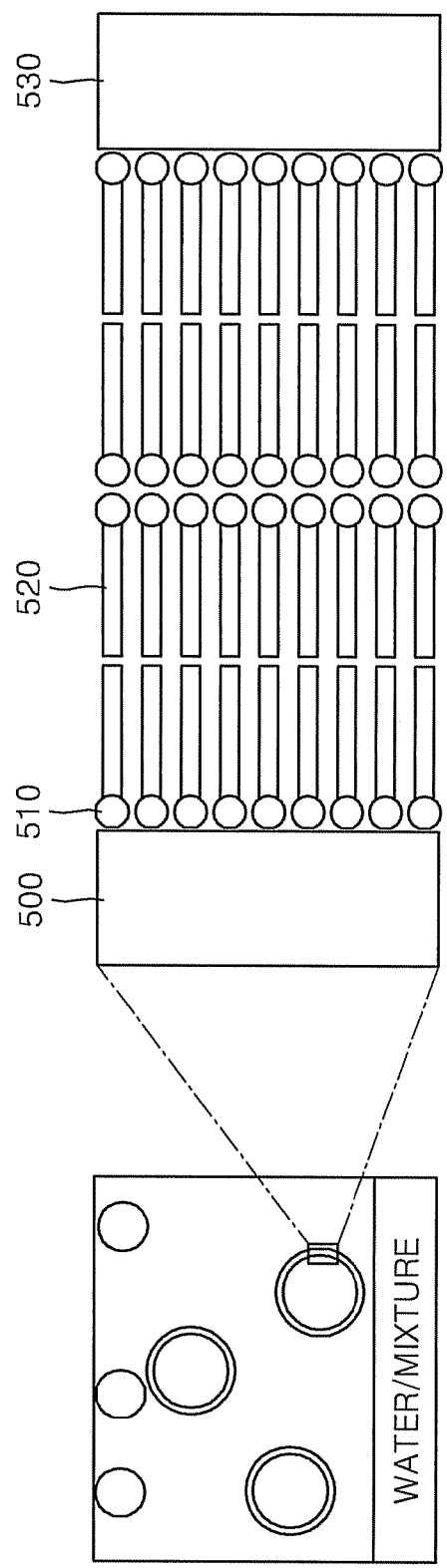
FIG. 5 schematically shows a stack of polymers having a hydrophilic part and a hydrophobic part.

In addition, the amphiphilic polymer, which can be a self-assembling polymer, can include a hydrophilic part and a hydrophobic part in one molecule. As shown in FIG. 5, the hydrophilic part 510 of the polymer combines with the hydrophilic catalyst layer 500 so that it is substantially uniformly aligned on the catalyst layer, and the hydrophobic part 520 of the amphiphilic polymer aligns in the opposite direction so that it is substantially combined with the hydrophilic part of another amphiphilic polymer that is not combined with the catalyst layer. When the amount of the amphiphilic polymer is sufficient, layers of the amphiphilic polymer can be caused to stack on the catalyst layer by the hydrophilic-hydrophobic bonds. The layers of amphiphilic polymer can be covered by water 530. The stacked layers, formed from a plurality of the amphiphilic polymers, can form a graphene layer upon heat-treatment. Thus, a graphene sheet having a desired thickness can be prepared since the number of layers of the graphene in the graphene sheet can be controlled by selecting an appropriate amphiphilic polymer and selecting the amount of the amphiphilic polymer.

The polymer coated on the catalyst layer is heat-treated to graphitize the polymer. The heat-treatment can be performed in stages to control the growth of the graphene sheet. For example, the carbonaceous material can be decomposed by a metal catalyst in a first heat-treatment to form carbon, and the carbon infiltrated into the catalyst layer to form a solid solution therein. Then, the carbon solid-solubilized in the metal catalyst can be precipitated to form a single-crystal graphene sheet on the surface of the catalyst layer in a second heat-treatment performed at a temperature lower than solubility limit of the metal catalyst. The first and second heat-treatments can be performed independently, simultaneously, or combined and performed in series.

In addition, the process can further include removing impurities, such as amorphous carbon formed on the surface of the catalyst layer, by polishing the surface of a carbon-containing catalyst layer formed after solid-solubilizing carbon atoms in the catalyst layer in the first heat-treatment.

The first and second heat-treatments can be performed in an inert or reducing atmosphere in order to prevent oxidization of the polymer. The first and second heat-treatments can each be performed at a temperature between about 300° C. to about 2,000° C., about 500° C. to about 1800° C., or about 600° C. to about 1700° C. When the temperature is lower than about 300° C., the graphitization cannot be sufficiently performed. On the other hand, when the temperature is higher than about 2,000° C., carbon can be evaporated. The heat-treatment may be performed for a time between about 0.001 hours to about 1000 hours, about 0.01 hours to about 100 hours, or about 0.1 hours to about 10 hours. When the heat-treatment time is not between about 0.001 hours to about 1000 hours, the graphitization can be insufficient, or efficiency can be decreased.

The heat-treatment can be performed by induction heating, radiant heating, laser heating, infrared heating (IR), microwave heating, plasma heating, ultraviolet (UV) ray heating, surface plasmon heating, or the like, or a combination comprising at least one of the foregoing heating methods without limitation. In particular, the graphitizing catalyst on which the polymer is coated can be activated by selectively heating the catalyst by the induction heating or using microwave radiation. Thus, a selected region can be graphitized, and a single-layered graphene sheet can be prepared by graphitizing a polymer having a short length. The carbon atoms from the carbonaceous material can be covalently bound to each other by the heat-treatment. For example, the carbon atoms can form a planar hexagonal structure to form a graphene sheet on the catalyst layer.

<Contacting a Single Crystalline Graphitizing Metal Catalyst With a Gaseous Carbonaceous Material>

Alternatively, a catalyst layer can be contacted with a gaseous carbon source containing a carbonaceous material, in addition to coating a carbonaceous material on the surface of the catalyst layer described above. Any material that can supply carbon and be in the gas phase at about 300° C. or higher can be used as the carbon source, without limitation. The gaseous carbon source can be a compound containing carbon atoms, specifically equal to or less than about 6 carbon atoms, more specifically equal to or less than about 4 or carbon atoms, and most specifically equal to or less than about 2 or carbon atoms. The carbon source can include at least one compound selected from the group consisting of carbon monoxide, ethane, ethylene, ethanol, acetylene, propane, propylene, butane, butadiene, pentane, pentene, cyclopentadiene, hexane, cyclohexane, benzene, toluene, and the like, and a combination comprising at least one of the foregoing compounds.

The carbon source can be added at a constant pressure to a chamber that comprises the catalyst layer. The pressure of the carbon source in the chamber can be about $10^{-6}$ to about $10^4$ toss, specifically about $10^{-3}$ to about $10^4$ torr. The carbon source can further include an inert gas such as helium, argon, or the like, or a combination comprising at least one of the foregoing inert gases.

In addition, hydrogen can be used with the gaseous carbon source in order to control gaseous reactions by cleaning the surface of the catalyst layer. Thus the carbon source can also include hydrogen. The amount of the hydrogen can be between about 0.1% to about 99.9% by volume, specifically about 10% to about 90% by volume, and more specifically about 15% to about 90% by volume based on the total volume of the chamber.

When the gaseous carbon source is added to the chamber containing the catalyst layer, and the chamber, including the catalyst layer heat-treated, graphene is formed on the surface of the catalyst layer. The heat-treatment temperature is an important factor for the formation of the graphene and can be between about 300° C. to about 2000° C., specifically about 700° C. to about 1200° C. When the heat-treatment temperature is less than about 300° C., the rate of graphene formation can be insufficient. On the other hand, when the heat-treatment temperature is greater than about 2000° C., graphene can overgrow or grow as particles or fibers, not as a single-crystal sheet.

The graphene formation can be controlled by the temperature and duration of the heat-treatment. That is, as the heat-treatment time is increased, the amount of graphene formed is increased, thereby increasing the thickness of the graphene sheet. As the heat-treatment time is reduced, the ultimate thickness of the formed graphene sheet is reduced. Accordingly, the heat-treatment time can be an important factor to control in order to obtain a desired thickness of the single-crystal graphene sheet. Other factors that can control the thickness of the graphene sheet include the type of the carbon source, the pressure of the carbon source, the type of graphitizing metal catalyst, and the size of the chamber. The heat-treatment can be performed for a time between about 0.001 hours to about 1000 hours. When the heat-treatment is performed for less than about 0.001 hours, the rate of graphene formation can be insufficient. On the other hand, when the heat-treatment is performed for longer than 1000 hours, formation of too much graphene can cause graphitization.

The heat-treatment can be performed by induction heating, radiant heating, laser heating, infrared (IR) heating, microwave heating, plasma heating, ultraviolet (UV) heating, surface plasmon heating, or the like, or a combination comprising at least one of the foregoing heating methods, without limitation. The heat source can be attached to the chamber to increase the temperature inside the chamber to a selected temperature.

The single-crystal graphene sheet obtained by the heat-treatment is cooled. Cooling is a process for uniformly growing the formed graphene and arranging the crystallographic orientation of the graphene in a selected direction. Since rapid cooling can cause cracks in the graphene sheet, the cooling can be performed slowly at a constant speed. For example, the cooling can be performed at a rate between about 0.1° C./minute to about 10° C./minute, or about 0.5° C./minute to about 5° C./minute, or about 1° C./minute to about 4° C./minute, or natural cooling can be used. Natural cooling is performed by removing the heat source used in the heat-treatment from the chamber, thus a sufficient cooling speed can be obtained by merely removing the heat source.

<Immersing a Single-Crystal Graphitizing Metal Catalyst in a Carbonaceous Material-Containing Solution>

A carbonaceous material can be disposed on the surface of a catalyst layer, or the carbon obtained by decomposing a carbonaceous material can be carburized in a catalyst layer by immersing catalyst layer in a liquid that comprises the carbonaceous material, and heating the catalyst layer.

The liquid can be an alcohol, a polyol, a mixture thereof, or a solution comprising at least one of an alcohol and a polyol. The polyol is a substance having a plurality of hydroxyl groups, for example a polyhydric alcohol. Exemplary polyols include ethylene glycol, propylene glycol, butylene glycol, tetraethyl glycol, glycerin, or the like, or a combination comprising at least one of the foregoing polyols.

When the catalyst layer is immersed in a solution comprising the carbonaceous material, for a selected period of time, the carbonaceous material can be bound to the surface of the catalyst layer or carburized in the catalyst layer. The catalyst layer, to which the carbonaceous material is bound, or in which carbon is carburized, is then heat-treated, as described above, to prepare a graphene sheet.

The heat-treatment can be performed in the same manner as described above in conjunction with the method of coating the polymer as the carbonaceous material.

The graphene sheet prepared by the above described coating, contacting or immersion processes and heat-treatment processes can have between about 1 layer to about 300 layers, specifically about 1 layer to about 60 layers, and more specifically about 1 layer to about 15 layers. A graphene sheet having over about 300 layers is regarded as graphite, which is distinct from graphene.

The catalyst layer can be used alone, or a plurality of catalyst layers can be stacked on a substrate. The substrate can be an inorganic substrate, such as a Si substrate, a glass substrate, a GaN substrate, a silica substrate, or the like, or a combination comprising at least one of the foregoing inorganic substrates, or the substrate can be a metal substrate comprising Ni, Cu, W, or the like, or a combination comprising at least one of the foregoing metals. In the case of a silica substrate, the surface of the silica substrate can be coated with a blocking layer in order to prevent unnecessary reactions between the substrate and the graphitizing metal catalyst. The blocking layer can be interposed between the substrate and the graphitizing catalyst to inhibit reduction in graphene formation efficiency caused by reactions between the graphitizing catalyst and the substrate. The blocking layer can be formed of $SiO_x$, TiN, $Al_2O_3$, $TiO_2$, $Si_3N$, or the like, or a combination comprising at least one of the foregoing materials, and can be disposed on the substrate by sputtering, or the like. The blocking layer can have a selected thickness, preferably between about 0.1 nanometers (nm) to about 1000 micrometers (μm). When the thickness of the blocking layer is less than about 0.1 nm, the desired effect of the blocking layer may not be obtained. On the other hand, when the thickness of the blocking layer is greater than about 1000 μm, costs can be increased.

The graphene sheet can be identified using Raman spectroscopy. That is, since pure graphene has a G' peak in the vicinity of about 1594 $cm^{-1}$, the formation of graphene can be identified by the presence of an absorption at this wavenumber. In particular, the graphene sheet formed using the catalyst layer can have minimized defects or no defects. The existence of defects in a graphene sheet can be identified by the presence of a D band in a Raman spectrum. The existence of the D band can indicate the existence of defects of the graphene sheet, and a high intensity of the D band peak can indicate a large number the defects.

The disclosed graphene sheet has few or no defects, and thus the D band may not be observed or only a very weak D band absorption may be observed. The single-crystal graphene sheet prepared by epitaxial growth using the catalyst layer has a peak ratio of D band/G band of equal to or less than about 0.2, specifically equal to or less than about 0.01, more specifically equal to or less than about 0.001, and most specifically "0" (zero).

The single-crystal graphene sheet can thus be formed on a catalyst layer which can be disposed on a substrate. The single-crystal graphene sheet can be used with the catalyst layer, or the graphene sheet can separated from the catalyst layer by dissolving and removing the catalyst layer using an acid-treatment, if desired. If desired, the single-crystal graphene sheet can be separated from the substrate.

The separated single-crystal graphene sheet can be processed in a variety of ways according to its desired use. That is, the single-crystal graphene sheet can be cut into a selected shape, or the single-crystal graphene sheet can be wound to form a tube. The processed single-crystal graphene sheet can also be combined with various articles to be applied in various ways.

The single-crystal graphene sheet can be applied in various fields and applications. The graphene sheet can be efficiently used as a transparent electrode since it has excellent conductivity and high uniformity. An electrode that is used as a substrate for a solar cell, or the like, is desirably formed to be transparent to allow light to penetrate therethrough. A transparent electrode formed from the single-crystal graphene sheet has excellent conductivity and flexibility due to the flexibility of the graphene sheet. A flexible solar cell can be prepared by using a flexible plastic as a substrate and the graphene sheet as a transparent electrode. In addition, when the graphene sheet is used in the form of a conductive thin film in a display device, the desired conductivity can be obtained using only a small amount of the single-crystal graphene sheet and light penetration can thus be improved.

In addition, the single-crystal graphene sheet formed in the form of a tube can be used as an optical fiber, a hydrogen storage medium, or as a membrane that selectively allows hydrogen to penetrate.

The disclosure will now be described in greater detail with reference to the following examples. The following examples are for illustrative purposes only and are not intended to limit the scope of the claims.

EXAMPLE 1

A single-crystal Ni thin film having a diameter of 1.2 cm and a thickness of 0.2 mm (having a (111) surface, Matec, Inc.) was placed in a reaction chamber, and heat-treated at 700° C. for 1 hour while flowing hydrogen into the chamber at 60 sccm to remove an oxide formed on the surface of the single-crystal Ni thin film. Then, the single crystal Ni thin film was heat-treated at 750° C. for 2 minutes using a halogen lamp heat source while introducing acetylene gas and hydrogen gas into the chamber at 5 sccm and 45 sccm respectively to form graphene on the single-crystal Ni thin film graphitizing catalyst.

Then, the heat source was removed and the chamber was naturally cooled to grow the graphene to a constant thickness, thereby forming a graphene sheet having a diameter of 1.2 cm and about 7 layers.

Then, the single-crystal Ni thin film on which the graphene sheet formed was dissolved by treatment in 0.1 M HCl for 24 hours to remove the Ni thin film and yield the single-crystal graphene sheet.

Figure 6:
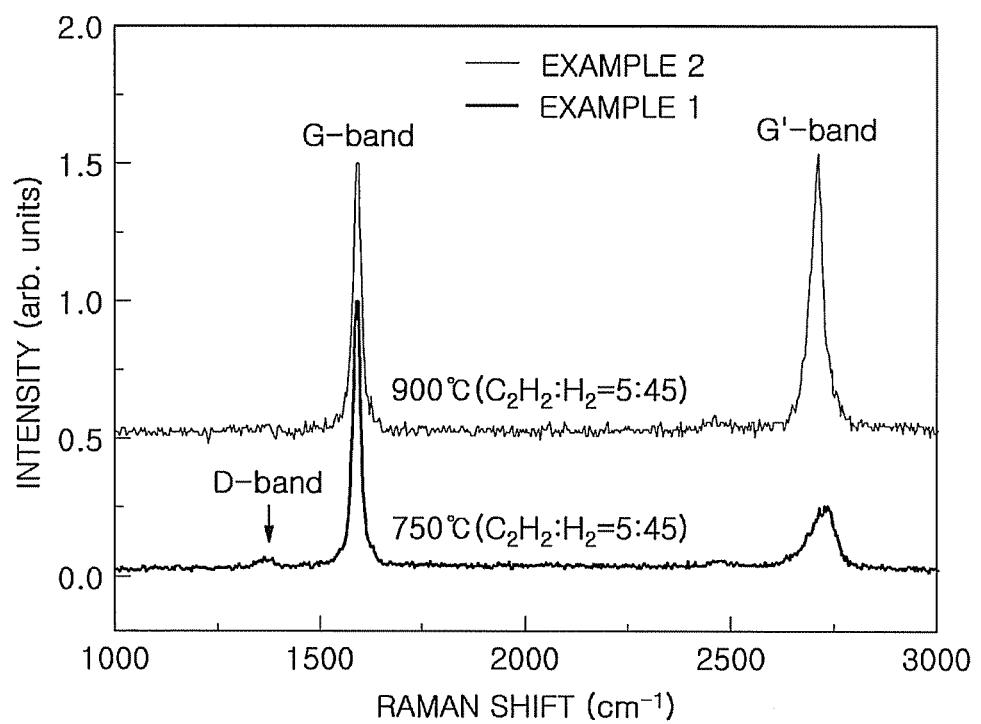
FIG. 6 is a graph illustrating Raman spectra of single-crystal graphene sheets prepared according to Examples 1 and 2.

FIG. 6 is a graph illustrating a Raman spectrum of the graphene sheet. Referring to FIG. 6, the formation of graphene was identified by G peak shown at 1594 cm$^{-1}$. In addition, a peak ratio of the D band to the G band was observed to be=0.193 using the D peak shown at 1360 cm$^{-1}$.

EXAMPLE 2

A Ni single crystal having a diameter of 1.2 cm and a thickness of 0.2 mm (having a (111) surface, Matec, Inc.) was placed in a reaction chamber on a substrate, and heat-treated at 700° C. for 1 hour while flowing hydrogen into the chamber at 60 sccm to remove an oxide formed on the surface of the single crystalline Ni. Then, the Ni single-crystal was heat-treated at 900° C. for 2 minutes using a halogen lamp heat source while introducing acetylene gas and hydrogen gas into the chamber at 5 sccm and 45 sccm respectively to form graphene.

Then, the heat source was removed and the chamber was naturally cooled to grow the graphene to a constant thickness, thereby forming a graphene sheet having a diameter of 1.2 cm and about 7 layers.

Then, the substrate on which the graphene sheet is formed was dissolved by treatment in 0.1 M HCl for 24 hours to remove the Ni thin film and yield the single-crystal graphene sheet.

FIG. 6 is a graph illustrating a Raman spectrum of the graphene sheet. Referring to FIG. 6, the formation of graphene was identified by the G peak shown at 1594 cm$^{-1}$. In addition, a D peak was not observed at 1360 cm$^{-1}$.

COMPARATIVE EXAMPLE 1

A polycrystalline Ni thin film having a width and a length of 1.2 cm and a thickness of 0.2 mm (Matec, Inc.) was placed in a reaction chamber, and the polycrystalline Ni thin film heat-treated at 700° C. for 1 hour while flowing hydrogen into the chamber at 60 sccm to remove an oxide formed on the surface of the polycrystalline Ni thin film. Then, the polycrystalline Ni catalyst was heat-treated at 750° C. for 2 minutes using a halogen lamp heat source while introducing acetylene gas and hydrogen gas into the chamber at 5 sccm and 45 sccm respectively to form graphene.

Then, the heat source was removed and the chamber was naturally cooled to grow the graphene to a constant thickness, thereby forming a graphene sheet having a width and a length of 1.2 cm and having about 7 layers.

Then, the polycrystalline Ni thin film on which the graphene sheet formed was dissolved by treatment in 0.1 M HCl for 24 hours to remove the polycrystalline Ni thin film to separate the graphene sheet.

Figure 7:
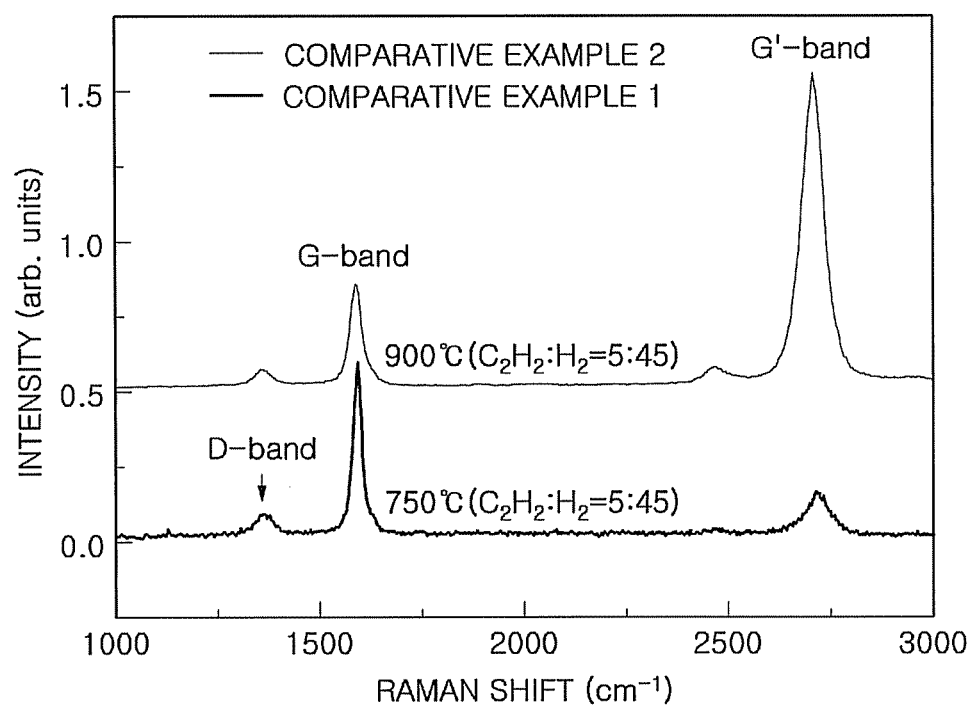
FIG. 7 is a graph illustrating Raman spectra of graphene sheets prepared according to Comparative Examples 1 and 2.

FIG. 7 is a graph illustrating a Raman spectrum of the graphene sheet. Referring to FIG. 7, the formation of graphene was identified by a G peak at 1594 cm$^{-1}$. In particular, the existence of defects in the graphene sheet was identified by a D peak at 1360 cm$^{-1}$. The D peak/G peak peak ratio was 0.261.

COMPARATIVE EXAMPLE 2

A polycrystalline Ni thin film having a width and a length of 1.2 cm and a thickness of 0.2 mm (Matec, Inc.) was placed in a reaction chamber, and heat-treated at 700° C. for 1 hour while flowing hydrogen into the chamber at 60 sccm to remove an oxide formed on the surface of the polycrystalline Ni thin film. Then, the polycrystalline Ni thin film was heat-treated at 900° C. for 2 minutes using a halogen lamp heat source while introducing acetylene gas and hydrogen gas into the chamber at 5 sccm and 45 sccm respectively to form graphene.

Then, the heat source was removed and the chamber was naturally cooled to grow the graphene to a constant thickness, thereby forming a graphene sheet having a width and a length of 1.2 cm and about 7 layers of graphene.

Then, the polycrystalline Ni thin film on which the graphene sheet formed was dissolved by treatment in 0.1 M HCl for 24 hours to remove the Ni thin film and separate the graphene sheet.

FIG. 7 is a graph illustrating Raman spectrum of the graphene sheet. Referring to FIG. 7, the formation of graphene was identified by [G']G peak at 1594 cm$^{-1}$. In particular, the existence of defects in the graphene sheet was identified by D peak at 1360 cm$^{-1}$, and the D peak/G peak peak ratio was observed to be 0.348.

Disclosed is an economical process for preparing a large-size single-crystal graphene sheet without defects, and a process for control of the thickness of the graphene sheet. The large-size single-crystal graphene sheet can have a desired thickness and can be applied to various fields and applications.

While the disclosed embodiments have been particularly shown and described with reference to exemplary embodiments thereof, it will be understood by those of ordinary skill in the art that various changes in form and details may be made therein without departing from the spirit and scope of the disclosure as defined by the following claims.

What is claimed is:

1. A method for preparing a single-crystal graphene sheet, the method comprising:
    forming a catalyst layer, the catalyst layer comprising a single-crystal graphitizing metal catalyst sheet;
    disposing a carbonaceous material on the catalyst layer; and
    heat-treating the catalyst layer and the carbonaceous material in at least one of an inert atmosphere and a reducing atmosphere to form a single-crystal graphene sheet.

2. The method of claim 1, wherein the carbonaceous material is solid-solubilized in the catalyst layer.

3. The method of claim 1, wherein the catalyst layer comprises a metal selected from the group consisting of Ni, Co, Fe, Pt, Au, Al, Cr, Cu, Mg, Mn, Mo, Rh, Si, Ta, Ti, W, U, V, Zr, a combination comprising at least one of the foregoing metals, and an alloy comprising at least one of the foregoing metals.

4. The method of claim 1, wherein the disposing a carbonaceous material on the catalyst layer comprises coating a carbon-containing polymer on a surface of the catalyst layer.

5. The method of claim 4, wherein the carbon-containing polymer is a self-assembling polymer.

6. The method of claim 4, wherein the carbon-containing polymer is a polymer selected from the group consisting of an amphiphilic polymer, a liquid crystal polymer, a conductive polymer, and a combination comprising at least one of the foregoing polymers.

7. The method of claim 4, wherein the carbon-containing polymer comprises a polymerizable functional group.

8. The method of claim 1, wherein the disposing a carbonaceous material on the catalyst layer comprises disposing a carbon-containing gas on the catalyst layer.

9. The method of claim 8, wherein the heat-treating is performed at a temperature between about 300° C. to about 2,000° C. for a time between about 0.001 hours to about 1000 hours.

10. The method of claim 8, wherein the carbon-containing gas is a gas selected from the group consisting of carbon monoxide, ethane, ethylene, ethanol, acetylene, propane, propylene, butane, butadiene, pentane, pentene, cyclopentadiene, hexane, cyclohexane, benzene, toluene, and a combination comprising at least one of the foregoing gases.

11. The method of claim 1, wherein the disposing a carbonaceous material on the catalyst layer is performed by immersing the catalyst layer in a liquid, wherein the liquid comprises the carbonaceous material.

12. The method of claim 1, wherein the heat-treating the catalyst layer comprises:
    a first heat-treating at a temperature and for a time sufficient to solid-solubilize the carbonaceous material in the catalyst layer; and
    a second heat-treating at a temperature and for a time sufficient to precipitate the solid-solubilized carbonaceous material and form a single-crystal graphene sheet.

13. The method of claim 1, wherein the disposing a carbonaceous material on the catalyst layer is performed by coating a carbon-containing polymer on a surface of the catalyst layer, wherein the heat-treating is performed at a temperature between about 300° C. to about 2,000° C. and for a time between about 0.001 hours to about 1000 hours.

14. The method of claim 1, further comprising separating the single-crystal graphene sheet from the catalyst layer by removing the catalyst layer by treating the single-crystal graphene sheet and the catalyst layer with an acid after the heat-treating.

15. A method for preparing a single-crystal graphene sheet, comprising:
    forming a catalyst layer, the catalyst layer comprising a single-crystal graphitizing metal catalyst sheet;
    disposing a self-assembling polymer on the catalyst layer;
    heat-treating the catalyst layer and the self-assembling polymer in at least one of an inert atmosphere and a reducing atmosphere to solid-solubilize a carbonaceous material in the catalyst layer; and
    heat-treating at a temperature and for a time sufficient to precipitate the solid-solubilized carbonaceous material and form a single-crystal graphene sheet.

* * * * *